US007560723B2

(12) United States Patent
Liu

(10) Patent No.: US 7,560,723 B2
(45) Date of Patent: Jul. 14, 2009

(54) ENHANCED MEMORY DENSITY RESISTANCE VARIABLE MEMORY CELLS, ARRAYS, DEVICES AND SYSTEMS INCLUDING THE SAME, AND METHODS OF FABRICATION

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/511,311

(22) Filed: Aug. 29, 2006

(65) Prior Publication Data

US 2008/0123397 A1 May 29, 2008

(51) Int. Cl.
*H01L 29/06* (2006.01)
*H01L 21/8242* (2006.01)

(52) U.S. Cl. .................. 257/5; 257/365; 257/E31.001; 257/E31.008; 438/242; 438/259

(58) Field of Classification Search .................. 438/95, 438/242, 259; 257/2, 4, 5, 365, 618, E31.001, 257/E31.008
See application file for complete search history.

(56) References Cited

U.S. PATENT DOCUMENTS 6,605,821 B1 8/2003 Lee et al.
7,442,602 B2 * 10/2008 Park et al. .................. 438/237
2006/0110878 A1 5/2006 Lung et al.
2006/0125108 A1 6/2006 Gutsche et al.
2007/0121369 A1 5/2007 Happ
2007/0232015 A1 * 10/2007 Liu ............................ 438/396
2007/0246766 A1 * 10/2007 Liu ............................ 257/314

FOREIGN PATENT DOCUMENTS

EP 1 351 253 A1 10/2003
WO WO 2005/117026 A1 12/2005

OTHER PUBLICATIONS

Written Opinion of the International Searching Authority, Mar. 12, 2009.

* cited by examiner

*Primary Examiner*—Hsien-ming Lee
(74) *Attorney, Agent, or Firm*—Dickstein Shapiro LLP

(57) ABSTRACT

A resistance variable memory cell and method of forming the same. The memory cell includes a first electrode and at least one layer of resistance variable material in contact with the first electrode. A first, second electrode is in contact with a first portion of the at least one layer of resistance variable material and a second, second electrode is in contact with a second portion of the at least one layer of resistance variable material.

70 Claims, 20 Drawing Sheets

ENHANCED MEMORY DENSITY RESISTANCE VARIABLE MEMORY CELLS, ARRAYS, DEVICES AND SYSTEMS INCLUDING THE SAME, AND METHODS OF FABRICATION

FIELD OF THE INVENTION

The invention relates to semiconductor devices and, in particular, to phase change memory elements and methods of forming and using the same.

BACKGROUND OF THE INVENTION

Non-volatile memories are useful elements of integrated circuits due to their ability to maintain data absent a power supply. Materials have been investigated for use in non-volatile memory cells. One class of programmable resistance materials are phase change materials, such as chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

A conventional phase change memory element 1, illustrated in FIGS. 1A and 1B, has a layer of phase change material 8 between first and second electrodes 2, 4, which are supported by a dielectric material 6. The phase change material 8 is set to a particular resistance state according to the amount of current applied between the first and second electrodes 2, 4. To obtain an amorphous state (FIG. 1B), a relatively high write current pulse (a reset pulse) is applied through the conventional phase change memory element 1 to melt at least a portion 9 of the phase change material 8 covering the first electrode 2 for a first period of time. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a set pulse) is applied to the conventional phase change memory element 1 for a second period of time (typically longer in duration than the crystallization time of amorphous phase change material) to heat the amorphous portion 9 of the phase change material 8 to a temperature below its melting point, but above its crystallization temperature. This causes the amorphous portion 9 of the phase change material 8 to re-crystallize to the crystalline state that is maintained once the current is removed and the conventional phase change memory element 1 is cooled. The phase change memory element 1 is read by applying a read voltage, which does not change the phase state of the phase change material 8.

One drawback of phase change memory is the large programming current needed to achieve the phase change. This requirement leads to large access transistor design and large circuit layout with typical memory cells ranging in size from about 16F2 to 40F2. Accordingly, it is desirable to have phase change memory devices with reduced programming current requirements and increased bit density.

BRIEF DESCRIPTION OF THE DRAWINGS

The advantages and features of the invention will become more apparent from the detailed description of embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments of the invention provide phase change memory devices enabling increased bit density as compared to conventional devices.

The invention is now explained with reference to the figures, which illustrate embodiments and throughout which like reference numbers indicate like features.

Figure 2A:
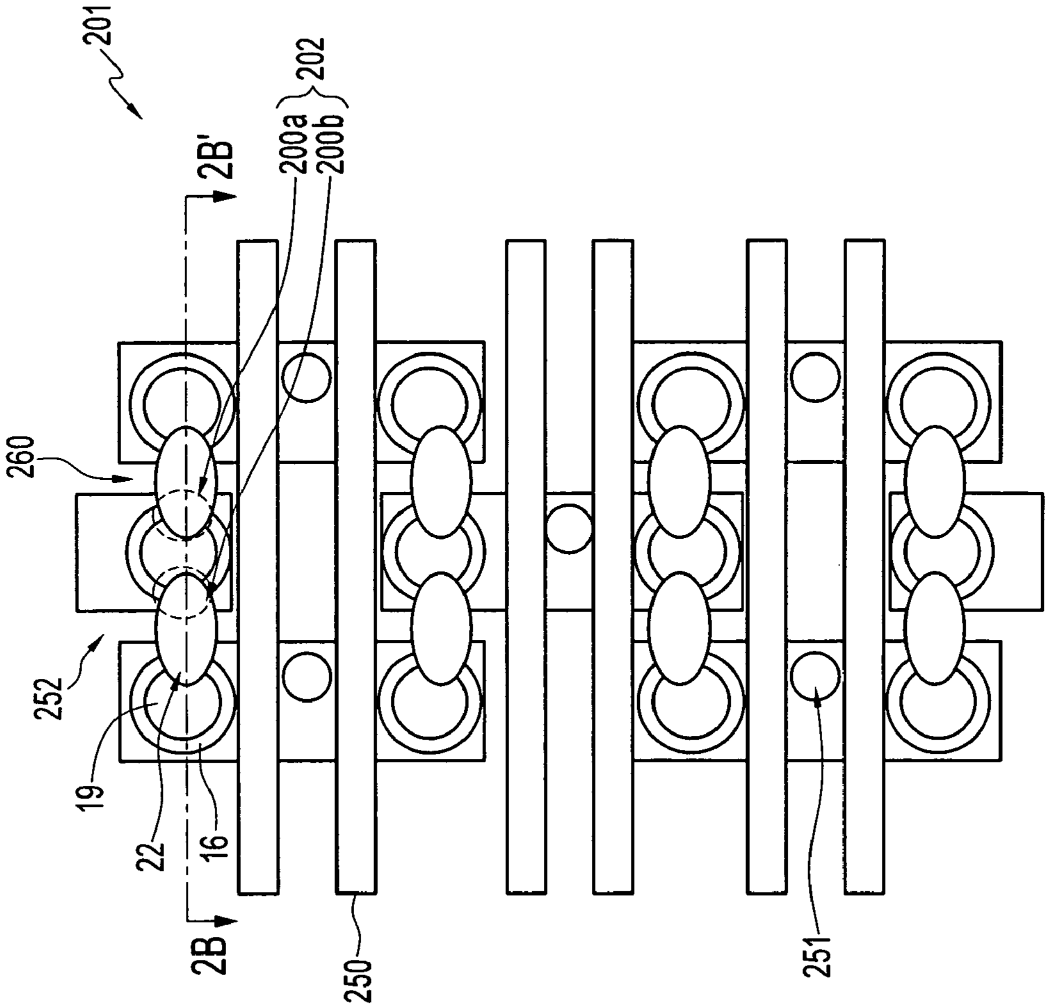
FIGS. 2A-2B illustrate partial cross-sectional and partial top-down views, respectively, of a phase change memory device according to an embodiment of the invention.
Figure 2B:
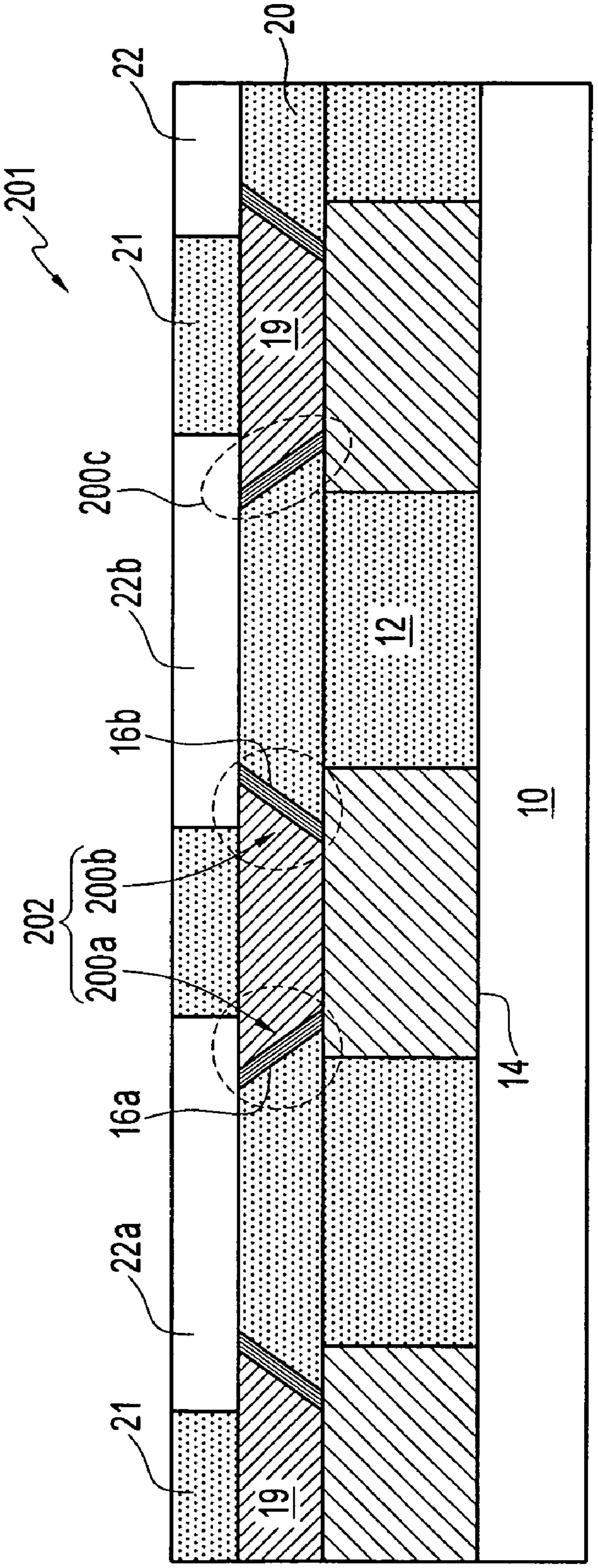

FIGS. 2A and 2B illustrate an embodiment of a portion of a resistance variable memory device 201 constructed in accordance with the invention. FIG. 2A is a top-down view of a portion of the memory device 201 and FIG. 2B is a cross-sectional view of the FIG. 2A device along the line 2B-2B'.

The memory device 201 is illustrated as a phase change memory device and includes a plurality of phase change memory elements 200*a*, 200*b*, 200*c*, each for storing at least one bit, i.e., logic 1 or 0. The memory elements 200*a*, 200*b*, 200*c* are supported by a substrate 10. A first dielectric layer 12 is formed on the substrate, and first electrodes 14 are formed within the first dielectric layer 12. The phase change memory device 201 also includes phase change material layers 16 formed over, and in electrical communication with, the first electrode 14. In the embodiment shown in FIG. 2B, the phase change material layers 16 are formed along a surface of a dielectric material 19 and within a second dielectric layer 20. As shown in FIG. 2A, the dielectric material 19 has a circular shape from a top-down perspective and the phase change material 16 has an annular shape from the top-down perspective. It should be understood that the dielectric material 19 can be formed to have a different shape, e.g., oval, square, among others, and therefore, the phase change material 16 can also be formed having a different shape. The phase change material layers 16 contact the bottom electrodes 14.

A third dielectric layer 21 is formed over the phase change material layers 16, the second dielectric layer 20 and the dielectric material 19. The second electrodes 22 are formed within the third dielectric layer 21.

The memory elements 200*a*, 200*b*, 200*c* correspond to where a first and second electrode and a portion of a phase change material layer 16 intersect electrically. Each first electrode 14 corresponds to a single memory cell 202 including two memory elements 200*a*, 200*b*. Thus, each first electrode 14 is associated with the two memory elements 200*a*, 200*b*. The memory element 200*a* is associated with a first, second electrode 22*a* and the memory element 200*b* is associated with a second, second electrode 22*b*. Thus, each memory cell 202 is associated with two different second electrodes, 22*a*, 22*b*.

In the illustrated embodiment, each second electrode 22 is also associated with two memory elements. For example, second electrode 22*b* is associated with memory elements 200*b* and 200*c*. Preferably, each second electrode is associated with memory elements 200*b*, 200*c* of different memory cells 202. Otherwise stated, a particular first electrode 14 and a particular second electrode 22 preferably are not associated with the same two memory elements 200*a*, 200*b*, 200*c*. This enables each individual memory element 200*a*, 200*b*, 200*c* to be selected by selecting the first and second electrodes 14, 22 that correspond to the particular element 200*a*, 200*b*, 200*c*.

Figure 1A:
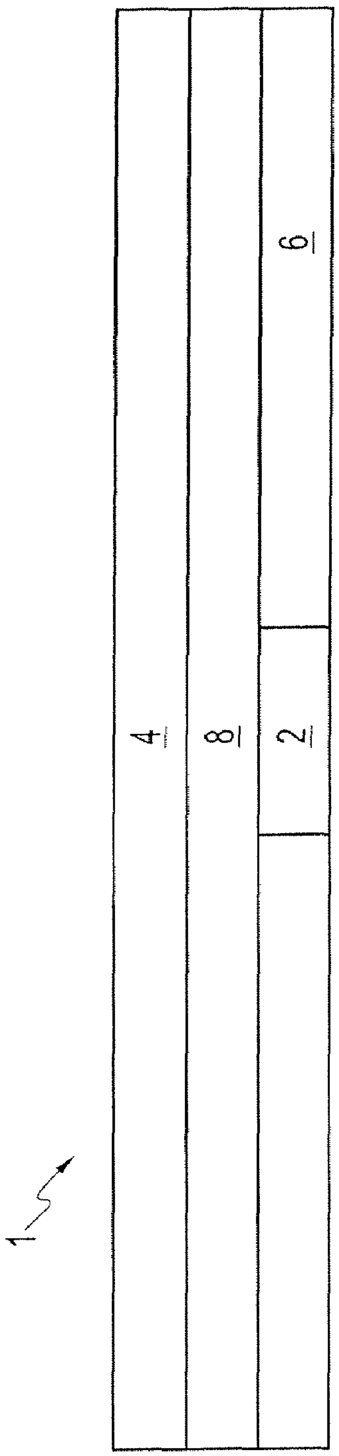
FIGS. 1A and 1B illustrate a conventional phase change memory element.
Figure 1B:
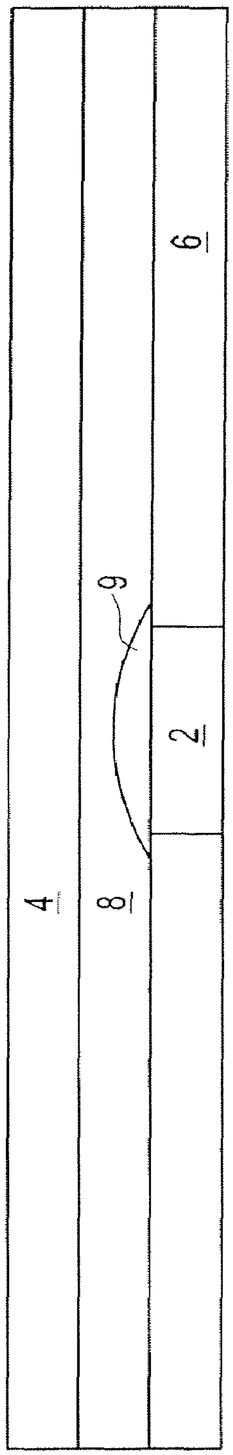

As shown in FIGS. 2A and 2B, the second electrodes 22 are offset from the bottom electrodes 14 and each phase change material layer 16. Accordingly, the contact area of the phase change material layer 16 to the electrodes 14, 22 for each memory element 200*a*, 200*b*, 200*c*, is minimized. The programming volume of the memory elements 200*a*, 200*b*, 200*c* and the voltage needed to achieve the phase change for the memory elements 200*a*, 200*b*, 200*c* is also minimized. Additionally, as structures, such as the electrodes, 14, 22 and phase change material layers 16 are shared between memory elements 200*a*, 200*b*, 200*c*, the bit density of the device 201 can be increased over prior art devices, e.g., devices including the memory element 1 (FIG. 1). In particular, since each first electrode 14 is associated with two memory elements 200*a*, 200*b*, the bit density of the device 201 can be doubled as compared to a conventional memory device including memory elements 1 (FIG. 1).

Additional dielectric layers and contact and metal lines can also be included in the device 201. For example, as shown in FIG. 2A, word lines 250, digit line contacts 251, and metal lines 252 for connecting the second electrodes 22 are included in the device 201.

FIGS. 3A-3D illustrate an embodiment of a method of fabricating the phase change memory device 201 illustrated in FIGS. 2A and 2B. No particular order is required for any of the actions described herein, except for those logically requiring the results of prior actions. Accordingly, while the actions below are described as being performed in a specific order, the order can be altered if desired.

Figure 3A:
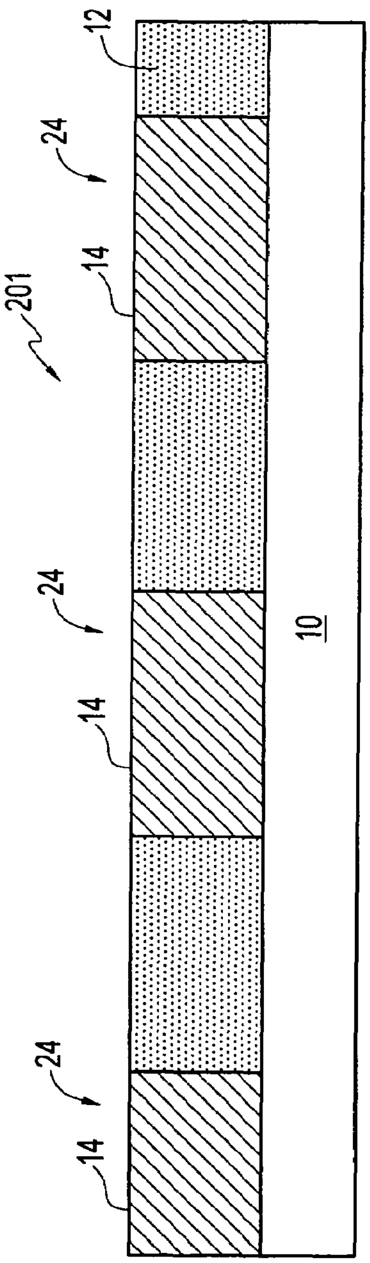
FIGS. 3A-3D illustrate partial cross-sectional views of a method of fabricating the phase change memory device of FIGS. 2A and 2B.

As shown in FIG. 3A a first dielectric layer 12 is formed over a substrate 10. The first dielectric layer 12 is etched to create vias 24 within which the first electrodes 14 are formed. The first electrodes 14 are be formed of any suitable conductive material, such as titanium-nitride (TiN), titanium-aluminum-nitride (TiAlN), titanium-tungsten (TiW), platinum (Pt) or tungsten (W), among others. In the illustrated embodiment, the first electrodes 14 are formed having a substantially circular top-down shape (FIG. 2A), however the first electrodes may have any shape, such as a rectangle, circle, square or other shape.

Figure 3B:
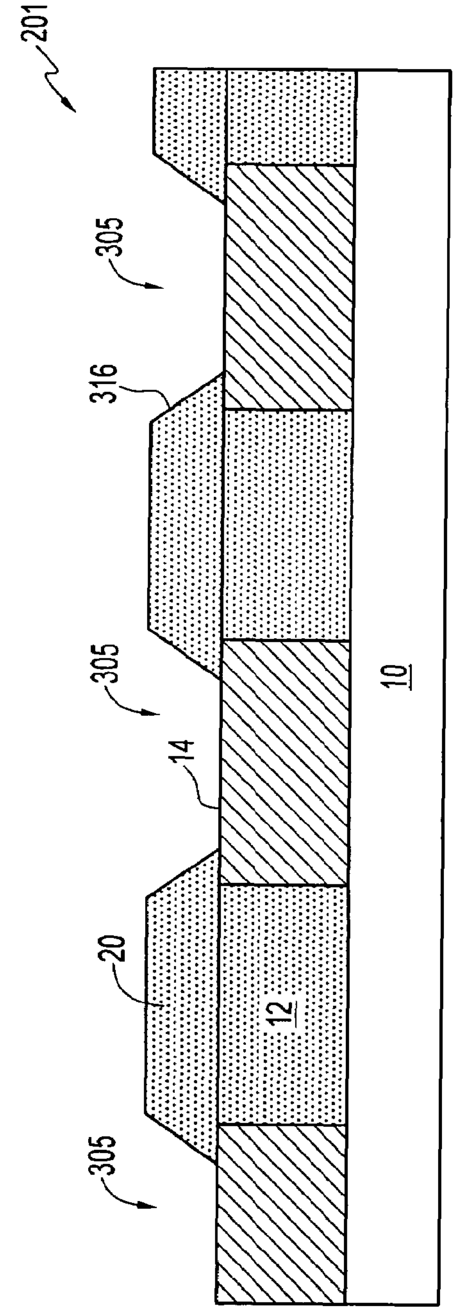

As depicted in FIG. 3B, a second insulating layer 20 is formed over the first electrodes 14 and the first insulating layer 12. An opening 305 is formed over and aligned with each first electrode 14 by any suitable technique. The openings 305 are preferably formed having sloped sidewalls 316 to improve the step coverage of the phase change material deposition, discussed below. It should also be noted that sloped sidewalls 316 are only optional, and that the sidewalls 316 can instead be vertical relative to a top surface of the first electrode 14, linear, non-linear, bowed, or any other desired shape.

In the FIGS. 2A-2B embodiment, the openings 305 are formed having a substantially circular top-down shape, however the openings 305 may have any shape.

Figure 3C:
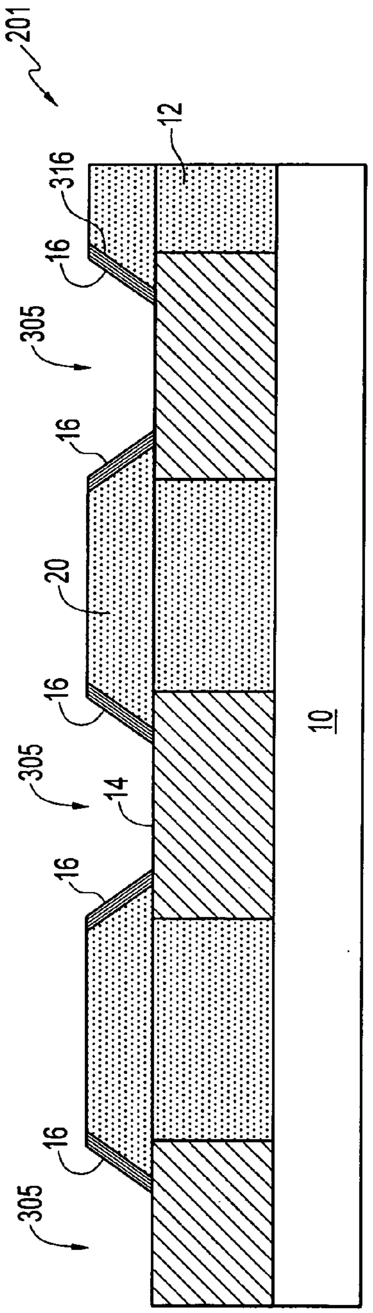

FIG. 3C illustrates the deposition of a conformal or a partially conformal phase change material layer 16 on the sidewalls 316 of openings 305. Any suitable techniques may be used to form the phase change material layer 16. In the illustrated embodiment, the deposited phase change material is a chalcogenide material, such as, for example, germanium-antimony-telluride and has a thickness of, for example, about 100 Å. The phase change material can also be or include one or more other phase change materials such as, for example, In—Se, Sb 2Te 3, GaSb, InSb, As—Te, Al—Te, GeTe, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

Although the thickness of the phase change material layer 16 on the sidewalls of the opening 305 is illustrated as being uniform, such a configuration is only one example of an implementation of the invention and is not limiting thereof. It should also be noted that the phase change material layer 16 need not completely cover the sidewalls 316 of each opening 305. For example, the phase change material layer 16 can only partially cover the sidewalls 316 to further reduce the volume of the phase change material layer 16 for a particular element 200*a*, 200*b*, 200*c*, which may further reduce the current necessary to switch the state of the phase change material layer 16.

Figure 3D:
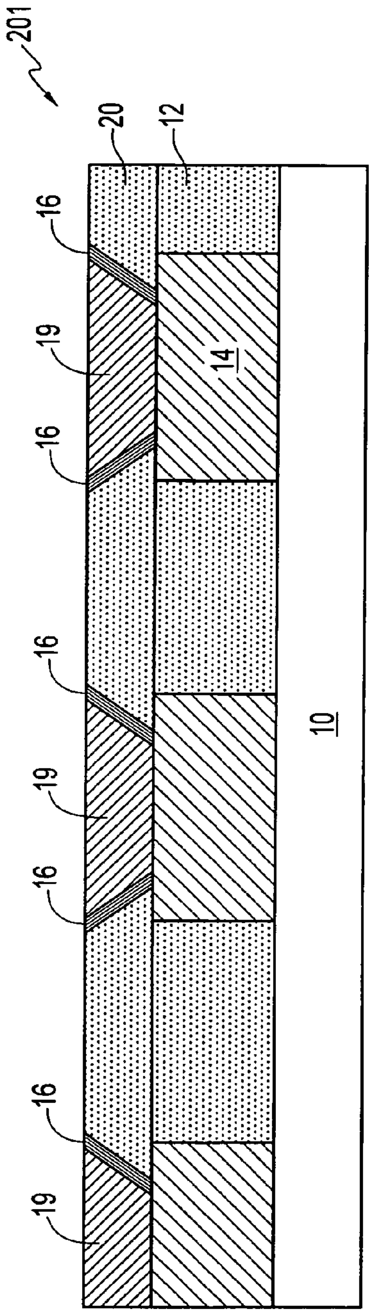

FIG. 3D illustrates the formation of a dielectric material 19 over the phase change material layer and filling the openings 305. In the illustrated embodiment, the dielectric material is an oxide. The dielectric material 19 can also be, for example, silicon nitrides; alumina oxides; high temperature polymers; low dielectric materials; insulating glass; or insulating polymers.

The dielectric material 19, phase change material layer 16 and second insulating layer 20 are subsequently planarized. The second electrodes 22 are then formed over the phase change material layer 16 and second insulating layer 20. The second electrodes 22 may be formed of any suitable conductive material, such as titanium-nitride (TiN), titanium-aluminum-nitride (TiAlN), titanium-tungsten (TiW), platinum (Pt) or tungsten (W), among others. In the illustrated embodiment, each second electrode 22 is formed over portions of at least two first electrodes 14 and in contact with a phase change material layer 16 formed on a portion of the sidewalls of at least two openings 305. In the illustrated embodiment, the second electrodes 22 are formed having a substantially oval top-down shape (FIG. 2A), however the second electrodes 22 may have any shape, such as a rectangle, circle, square or other shape.

Figure 4A:
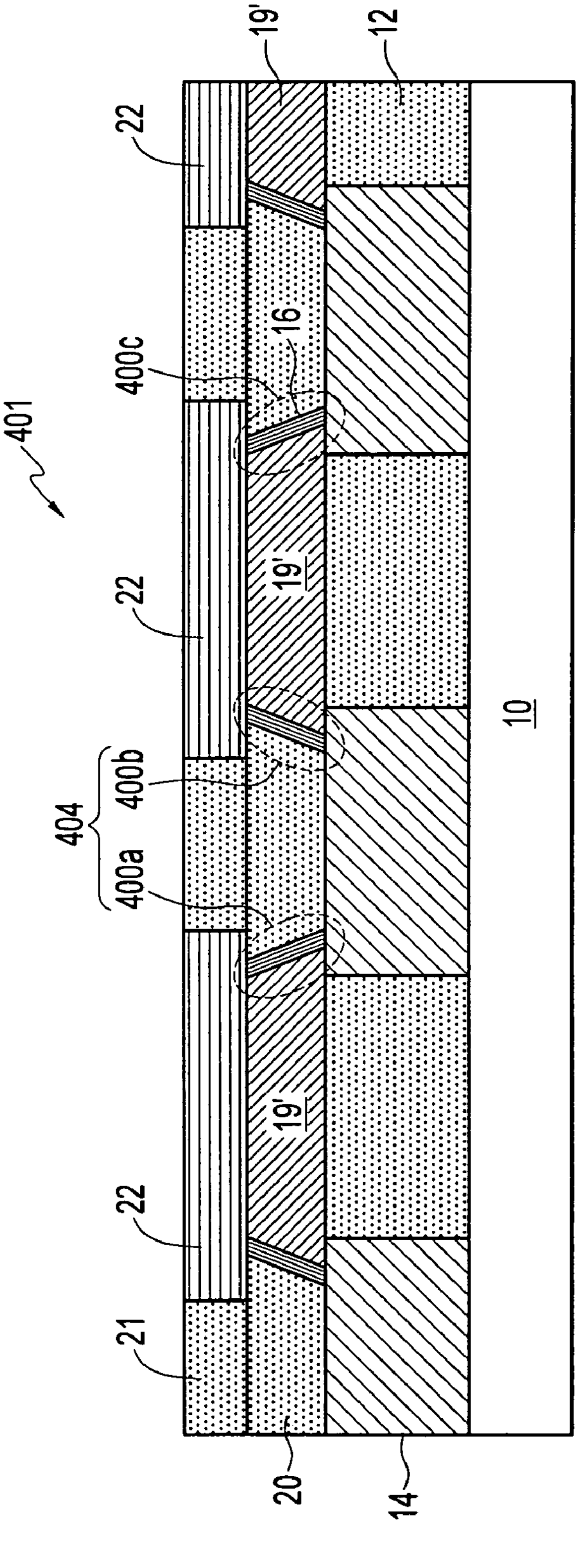
FIGS. 4A-4B illustrate partial cross-sectional views of a phase change memory device according to another embodiment of the invention.
Figure 4B:
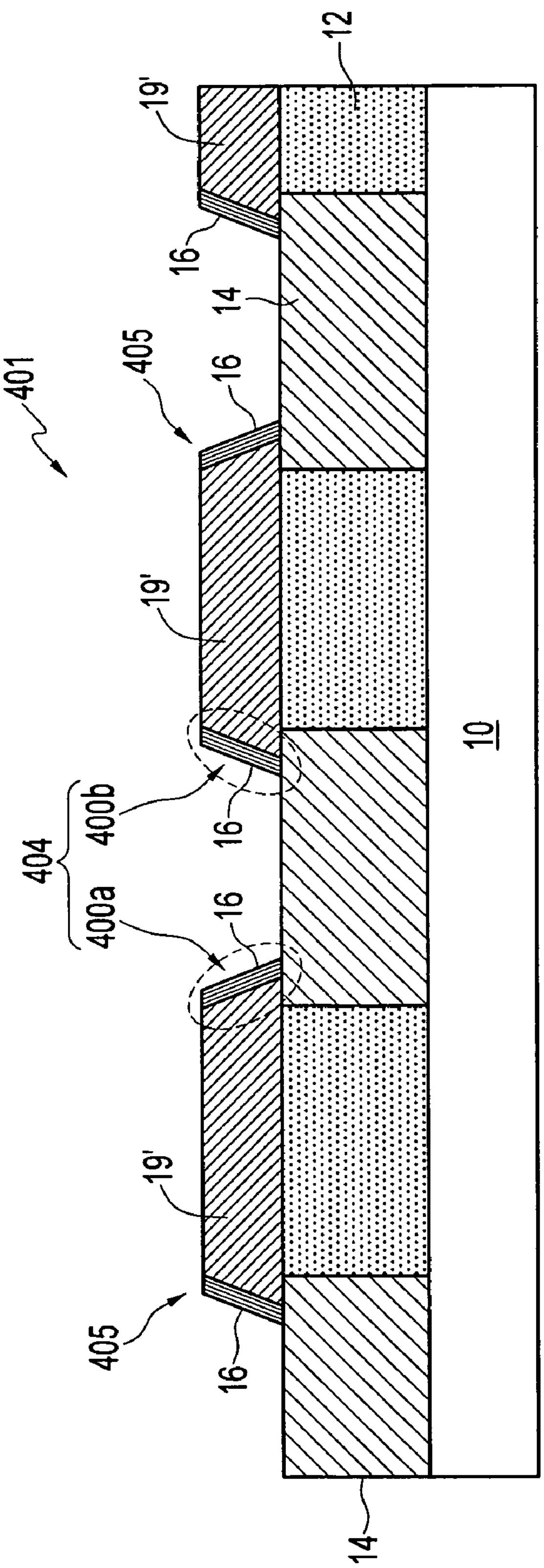

FIGS. 4A and 4B illustrate a phase change memory device 401 according to other embodiments of the invention. The device 401 includes memory cell 404, which includes two memory elements 400*a*, 400*b*. The phase change memory device 401 is similar to the phase change memory device 201 (FIGS. 2A-2B) except that the second electrodes 22 are aligned with the phase change material layers 16 and dielectric layers 19 and the bottom electrodes 14 are below portions of two phase change material layers 16 and dielectric layers 19. Additionally, the phase change material layers 16 are formed on sidewalls of dielectric mesas 19'. Thus, the phase change material layers 16 are sloped in opposite directions than those of the memory device 201 (FIGS. 2A-2B).

FIG. 4B shows the formation of the memory device 401 in accordance with embodiments of the invention. No particular order is required for any of the actions described herein, except for those logically requiring the results of prior actions. Accordingly, while the actions below are described as being performed in a specific order, they can be altered if desired.

The first electrodes 14 can be formed as described in connection with FIG. 3A above. As shown in FIG. 4B, a mesa of dielectric material 19' is formed over the first dielectric layer 12. The dielectric mesa 19' is formed to overlie portions of two first electrodes 14. A layer 16 of phase change material is formed on the sidewalls of the dielectric mesa 19'. To achieve the structure shown in FIG. 4B, the dielectric mesa 19' is formed by, for example, patterning and etching a dielectric layer to form mesa using known photolithography and etching techniques.

As in the device 201 (FIGS. 2A-2B) the dielectric mesas 19' are substantially circular from a top-down perspective. Accordingly, the phase change material layers 16 are annular from a top-down perspective. The mesas 19' and phase change material layers 16, however, can have other shapes.

Figure 5A:
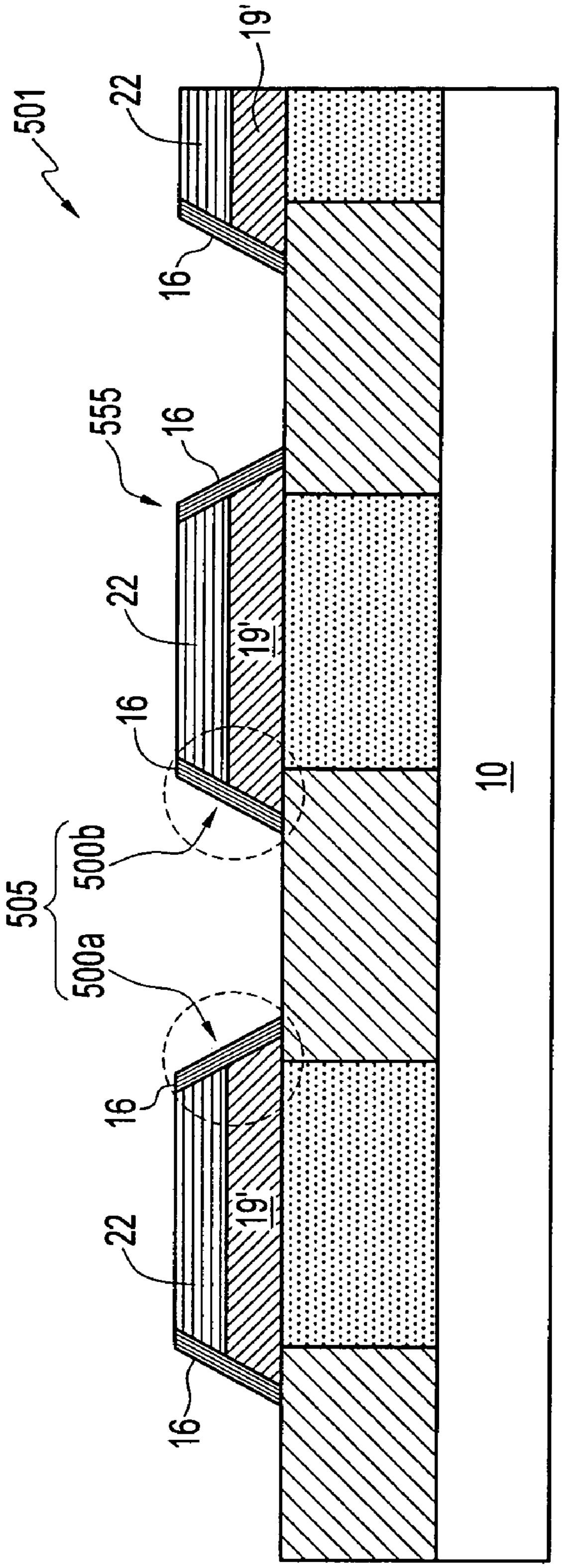
FIGS. 5A-5B illustrate partial cross-sectional views of a phase change memory device according to another embodiment of the invention.
Figure 5B:
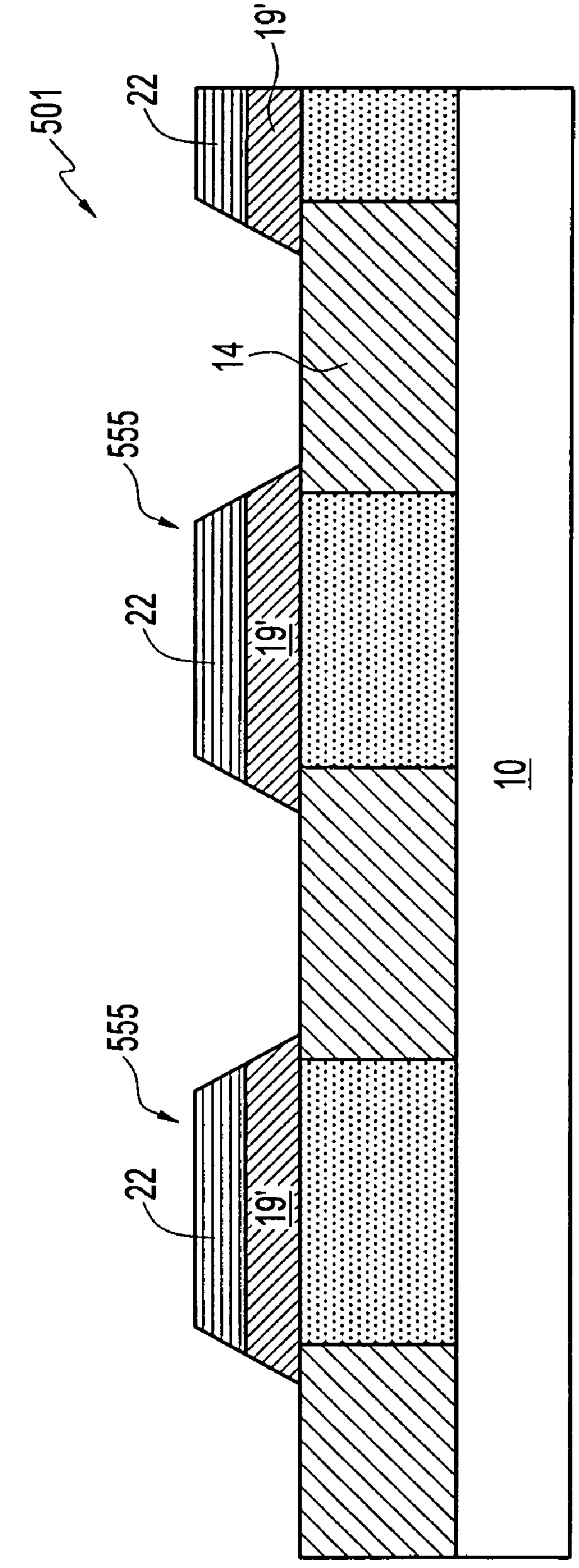

FIGS. 5A and 5B illustrate a phase change memory device 501 according to other embodiments of the invention. The device 501 includes memory cell 505, which includes two memory elements 500*a*, 500*b*. The phase change memory device 501 is similar to the phase change memory devices 401 (FIG. 4A) except that the second electrodes 22 are formed as part of a mesa structure 555 with the dielectric mesa 19'. The phase change material layers 16 are formed on sidewalls of the mesa structure 555.

FIG. 5B shows the formation of the memory device 501 in accordance with an embodiment of the invention. No particular order is required for any of the actions described herein, except for those logically requiring the results of prior actions. Accordingly, while the actions below are described as being performed in a specific order, the order can be altered if desired.

The first electrodes 14 are formed as described in connection with FIG. 3A above. As shown in FIG. 5B, mesa structures 555 are formed, each including a dielectric layer 19' and a second electrode 22. The second electrode 22 is formed as a layer of the mesa structure 555. The mesa structure 555 is formed to overlie portions of two first electrodes 14. A layer 16 of phase change material is formed on the sidewalls of the mesa structure 555. The mesa structure 555 can be formed by, for example, patterning and etching a dielectric layer and conductive layer using known photolithography and etching techniques. The phase change material layers 16 are formed on sidewalls of the mesa structure 555 to achieve the structure shown in FIG. 5A.

Similar to device 201 (FIGS. 2A-2B), the mesa structure(s) 555 of the illustrated embodiment is substantially circular from a top-down perspective. Accordingly, the phase change material layers 16 are annular from a top-down perspective. The mesa structures 555 and phase change material layers 16, however, may have other shapes, as discussed above.

FIGS. 6-9 illustrate additional embodiments of the invention. The embodiments shown in FIGS. 6-9 are similar to the embodiments of FIGS. 2A-5B. In the FIGS. 6-9 embodiments, however, each first and second electrode is associated with two memory elements. Preferably, a particular first electrode and a particular second electrode are not associated with the same two memory elements to allow for individual selection of each memory element during operation. In the FIGS. 6-9 embodiments, instead of forming the phase change material layers on sidewalls of an opening (as in FIGS. 2A-3D) or a mesa structure (as in FIGS. 4A-5B), the first electrodes are formed on sidewalls of an opening or mesa structure as described below.

Figure 6:
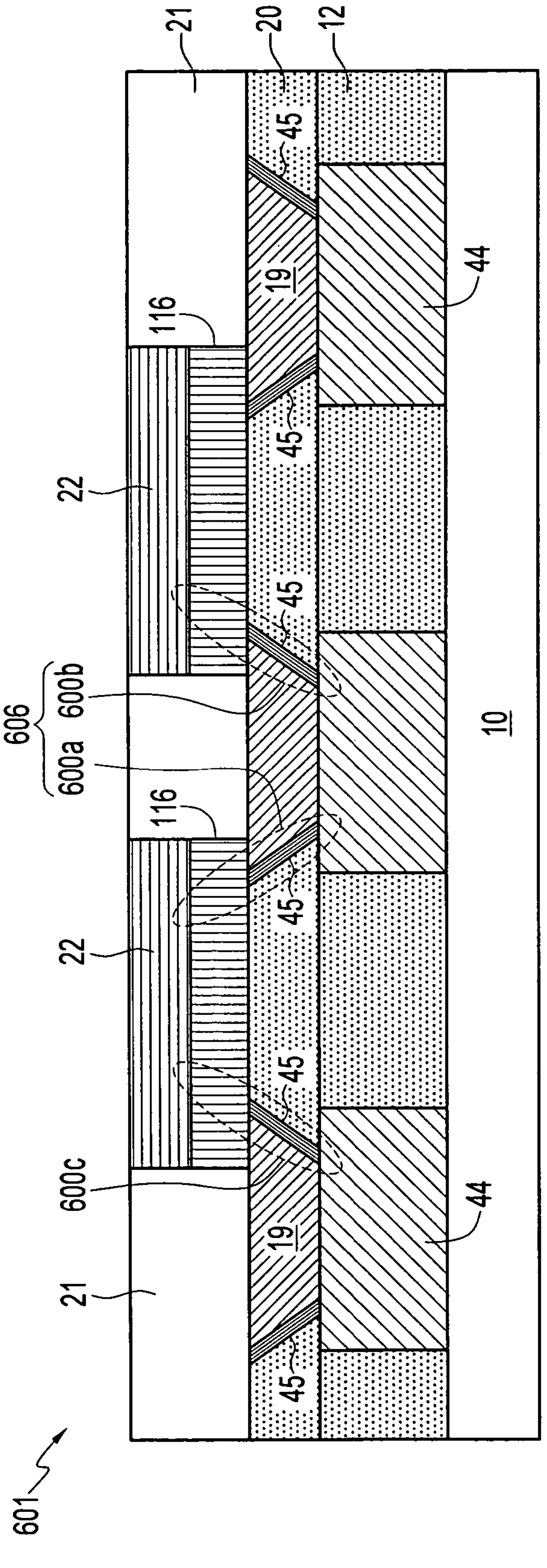
FIGS. 6-9 illustrate partial cross-sectional views of a phase change memory devices according to additional embodiments of the invention.

FIG. 6 depicts a phase change memory device 601 having a memory cell 606 that includes memory elements 600*a*, 600*b* according to the invention. The phase change memory device 601 includes conductive plugs 44 for contacting first electrodes 45. The conductive plugs 44 are formed in the same manner as the first electrodes 14 as described in connection with FIG. 3A above.

The first electrodes 45 are on sidewalls of dielectric material layers 19. The first electrodes 45 and dielectric material layers 19 are formed in a similar manner to the phase change material layer 16 and dielectric material layers 19 as described in FIGS. 3B-3D above. Accordingly, a conductive material for electrodes 45 is formed on sidewalls of the openings in insulating layer 20. Dielectric material layers 19 are then formed within the openings between the first electrodes 45. From a top-down perspective the dielectric material layers 19 are substantially circular. Accordingly, the first electrodes 45 are annular from a top-down perspective. The dielectric material layers 19 and first electrodes 45, however, can have other shapes.

Optionally, the first electrodes need not fully cover the sidewalls of the dielectric material layers 19, and only need be formed so as to provide electrical communication between a respective conductive plug 44 and phase change material layer 116 for a single memory element 600*a*, 600*b*. Further, while the thickness of the first electrodes 45 is shown being uniform, the invention is not so limited.

Phase change material layers 116 and second electrodes 22 are within an insulating layer 21 and over the first electrodes 45. As shown in FIG. 6, the phase change material layers 16 and second electrodes 22 are offset from the first electrodes

45 and conductive plugs 44. Thus, a phase change material layer 116 is in contact with two adjacent first electrodes 45. Also, each top electrode 22 serves two memory elements 600*a*, 600*c*.

Figure 7:
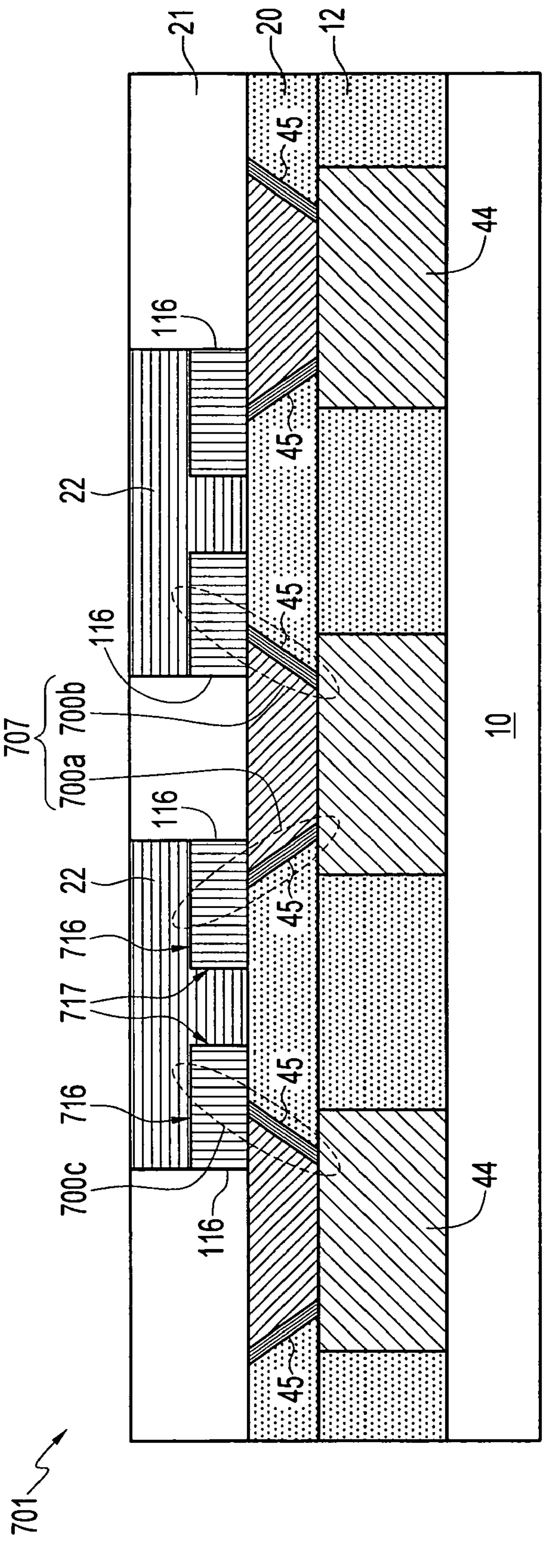

The memory device 701 shown in FIG. 7 is similar to memory device 601, except that there is a phase change material layer 116 for each first electrode 45. The memory device 701 includes a memory cell 707, which includes memory elements 700*a*, 700*b*. Each second electrode 22 serves two memory elements 700*a*, 700*c*. In the embodiment of FIG. 7, the second electrode 22 serving two memory elements 700*a*, 700*c* extends between the phase change material layers 116 for those two memory elements 700*a*, 700*c*. Accordingly, the second electrode 22 is in contact with top surfaces 716 and lateral surfaces 717 of the phase change material layers 113. To achieve the top electrode 22 structure shown in FIG. 7, the phase change material layer 116 are be patterned and etched prior to the formation of the top electrodes 22.

Figure 8:
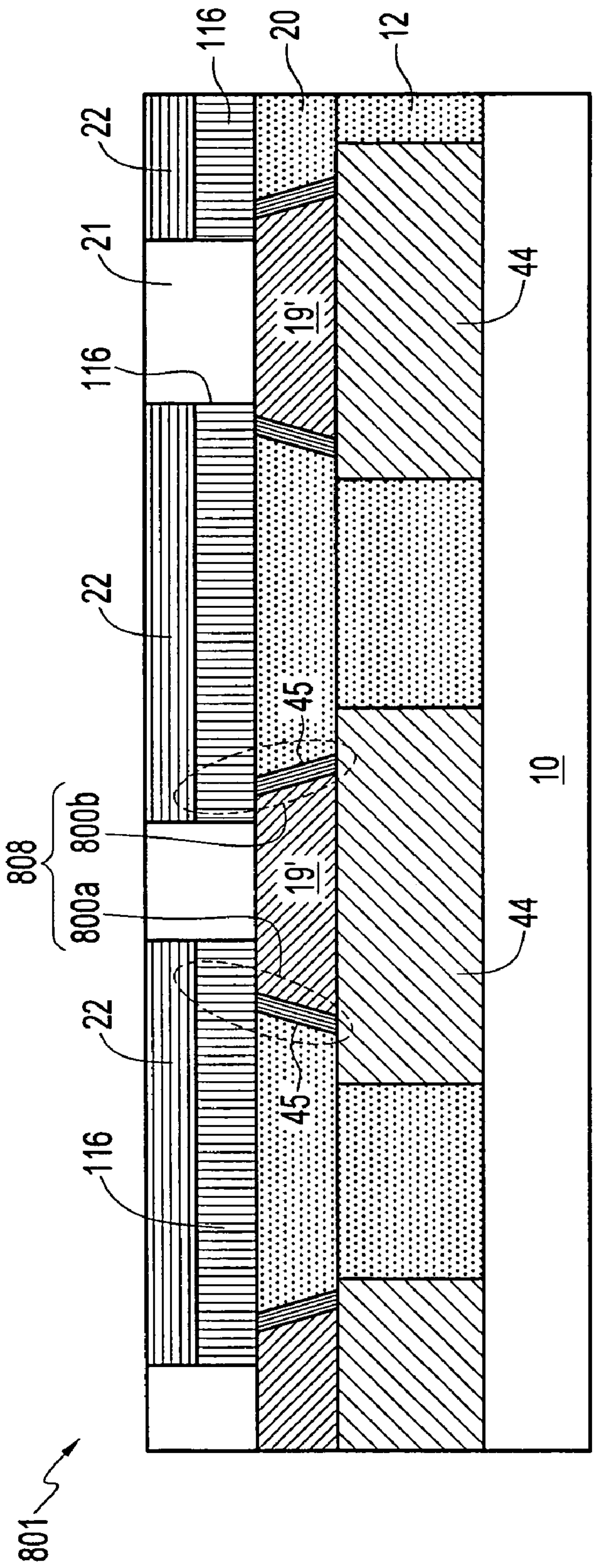

FIG. 8 illustrates memory device 801 having a memory cell 808, which includes memory elements 800*a*, 800*b* according to the invention. The memory device 801 is similar to memory device 601 (FIG. 6) except that the first electrodes 45 are formed on sidewalls of a dielectric mesa 19'. The dielectric mesas 19' and first electrodes 45 are formed in a similar manner to the phase change material layer 16 and dielectric material layers 19 as described in FIGS. 3B-3D above.

Figure 9:
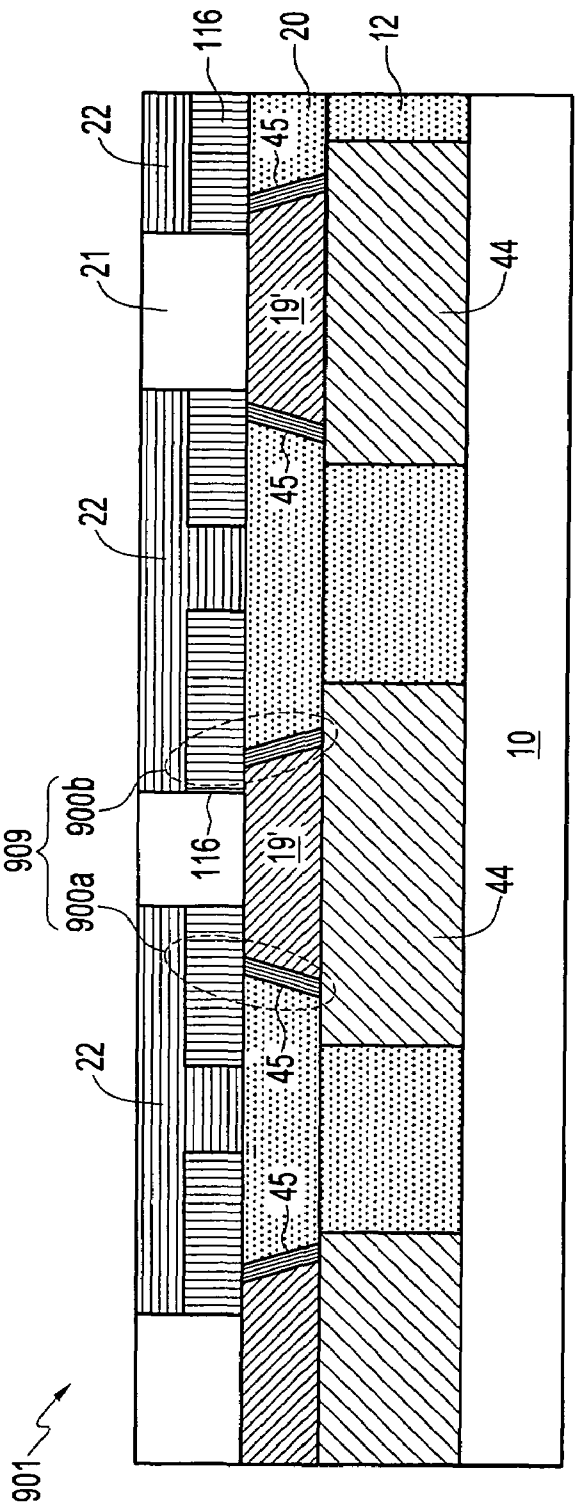

FIG. 9 illustrates memory device 901 having a memory cell 909, which includes memory elements 900*a*, 900*b* according to the invention. The memory device 901 is similar to memory device 701 (FIG. 7) except that the first electrodes 45 are formed on sidewalls of a dielectric mesa 19'. The dielectric mesas 19' and first electrodes 45 are formed in a similar manner to the phase change material layer 16 and dielectric material layers 19 as described in FIGS. 3B-3D above.

Figure 10:
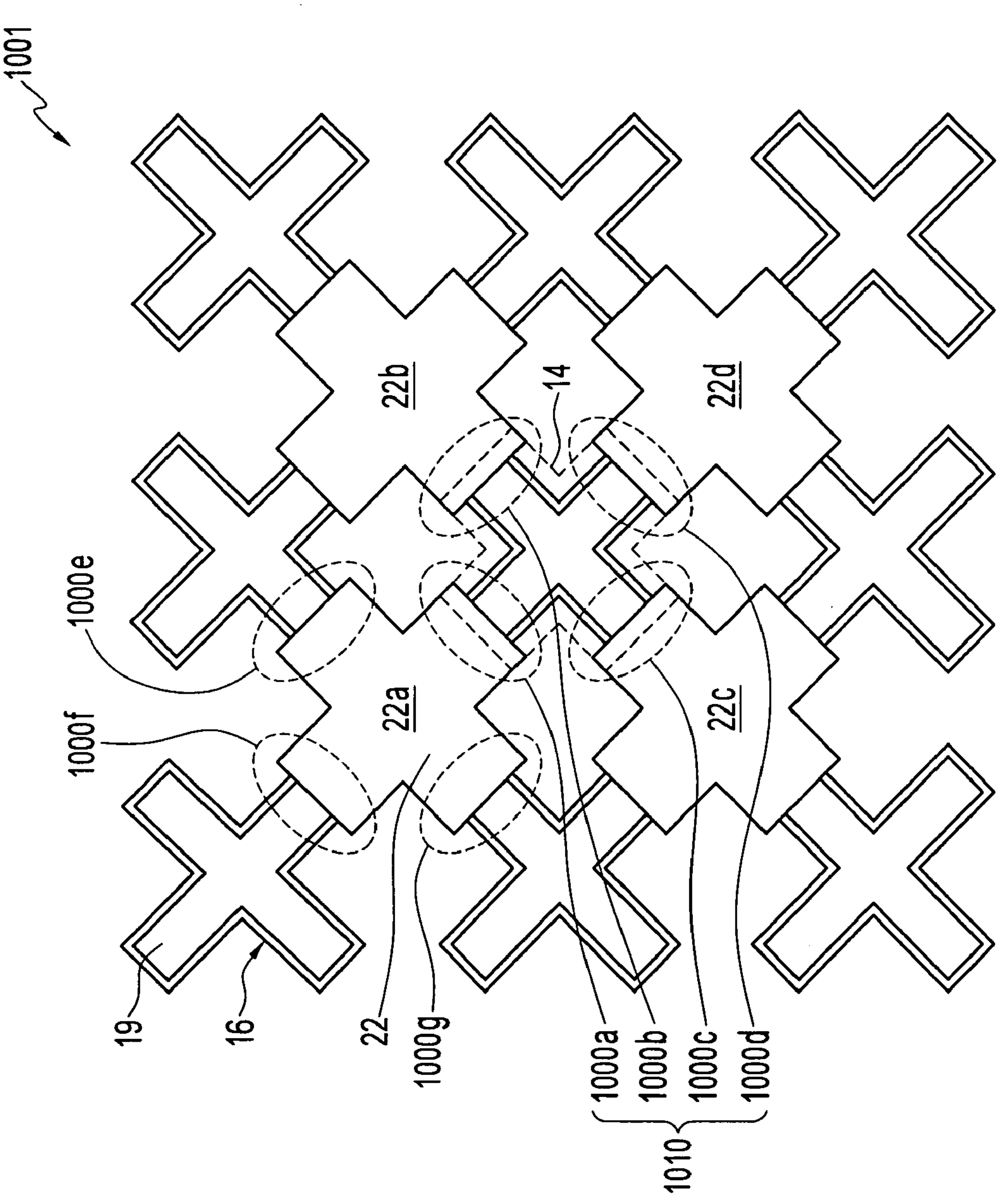
FIG. 10 illustrates a top-down view of a phase change memory device according to another embodiment of the invention.

Although the embodiments shown in FIGS. 2A-9 show memory cells including two memory elements, the invention, however, is not so limited. Memory cells according to the invention can include more than two memory elements. For example, as shown in FIG. 10, the memory device 1001 includes memory cells 1010, which include memory elements 1000*a*, 1000*b*, 1000*c*, 1000*d*. Each of the memory elements 1000*a*, 1000*b*, 1000*c*, 1000*d* of the memory cell 1000 is associated with a same first electrode 14. The memory element 1000*a* is associated with a first, second electrode 22*a*; the memory element 1000*b* is associated with a second, second electrode 22*b*; the memory element 1000*c* is associated with a third, second electrode 22*c*; and the memory element 1000*d* is associated with a fourth, second electrode 22*d*. Thus, each memory cell 1010 is associated with four different second electrodes 22.

In the illustrated embodiment, second electrode 22 is shared by four memory elements 1000*a*, 1000*e*, 1000*f*, 1000*g*. To allow each memory element 1000*a*, 1000*b*, 1000*c*, 1000*d*, 1000*e*, 1000*f*, 1000*g* to be addressed individually, only one memory element, e.g., element 1000*a*, is addressable by a particular first and second electrode 14, 22 set.

The memory device 1001 memory elements 1000*a*, 1000*b*, 1000*c*, 1000*d*, 1000*e*, 1000*f*, 1000*g* have a structure similar to any of those described above in connection with FIGS. 2B-9 and are formed in a similar manner, except that each memory cell is configured to include four memory elements 1000*a*, 1000*b*, 1000*c*, 1000*d*. For this, the first electrode 14 of the memory cell 1010 is configured to be associated with the memory elements 1000*a*, 1000*b*, 1000*c*, 1000*d*. In the FIG. 10 embodiment, the first and second electrodes 14, 22 have approximately a plus-sign ("+") shape, but other shapes are possible, such as a cross, x, diamond, square, among others.

Figure 11A:
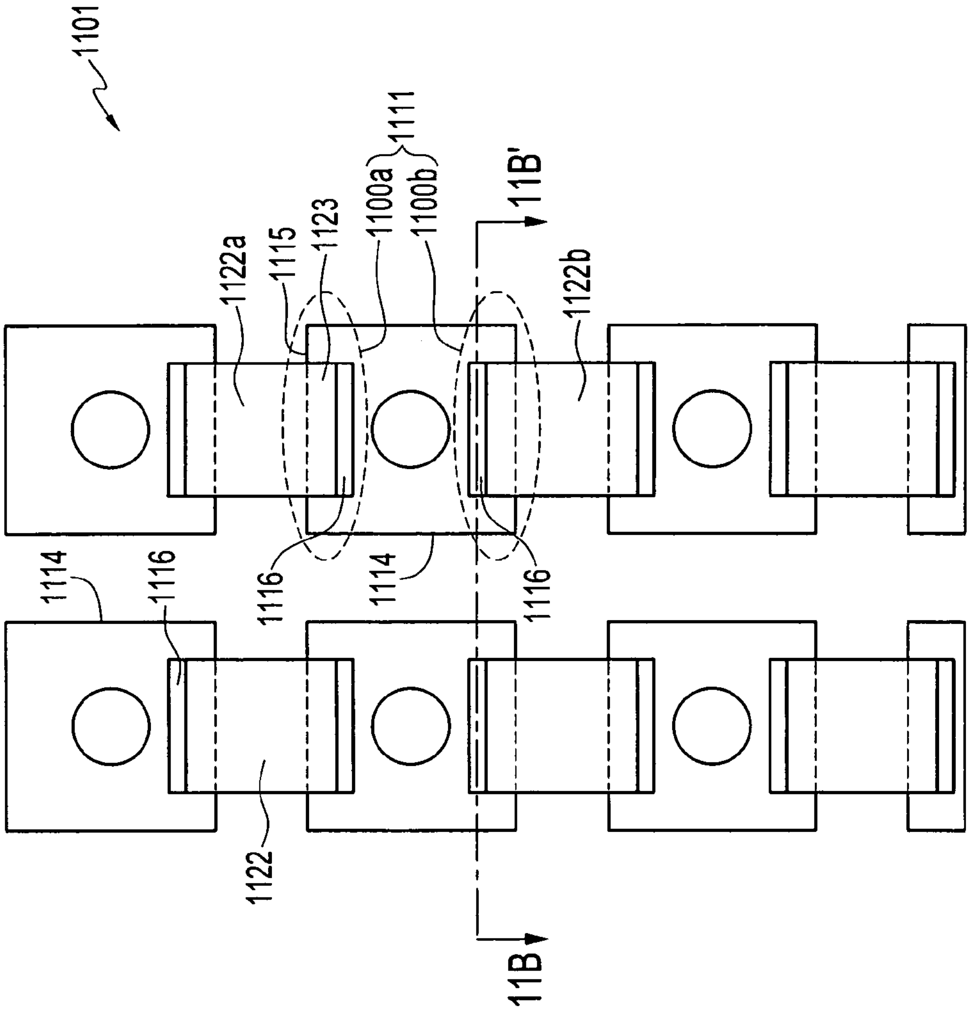
FIGS. 11A-11C illustrate partial cross-sectional and partial top-down views of a phase change memory device according to another embodiment of the invention.
Figure 11B:
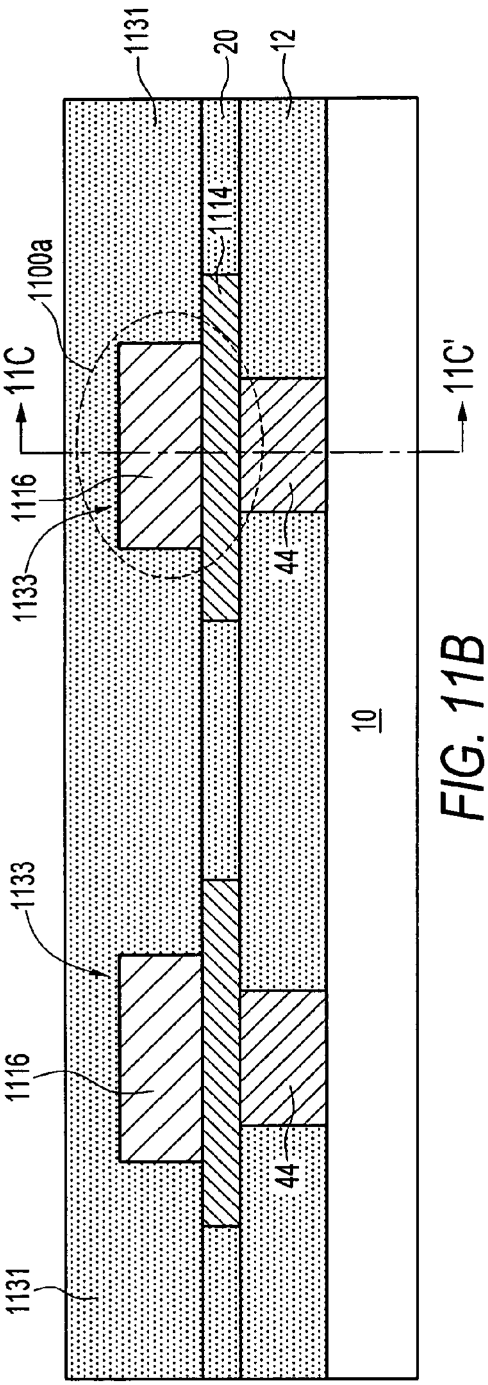
Figure 11C:
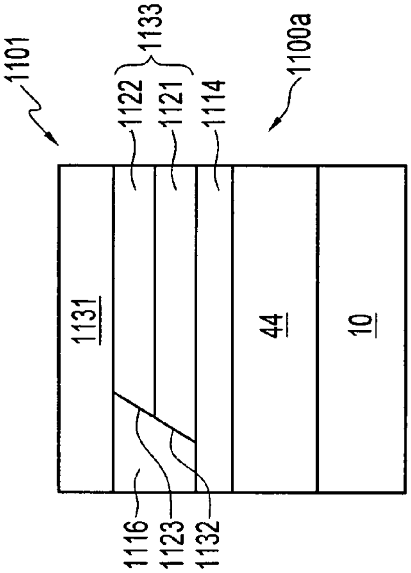

FIGS. 11A-11C illustrate an embodiment of a portion of a resistance variable memory device 1101 constructed in accordance with the invention. FIG. 11A is a top-down view of a portion of the memory device 1101 and FIG. 11B is a cross-sectional view of the FIG. 11A device 1101 along the line 11B-11B'. FIG. 11C is a cross-sectional view of the device 1101 along the line 11C-11C' shown in FIG. 11B.

The memory device 1101 is illustrated as a phase change memory device and includes memory cells 1111, which each include a plurality of phase change memory elements 1100*a*, 1100*b*, each for storing at least one bit, i.e., logic 1 or 0. The memory elements 1100*a*, 1100*b* are supported by a substrate 10. A first dielectric layer 12 is formed on the substrate 10, and conductive plugs 44 are formed within the first dielectric layer 12. First electrodes 1114 are formed within a second dielectric layer 20. Each first electrode 1114 is formed over and in contact with a conductive plug 44.

A third dielectric layer 1121 (FIG. 11C) is over the first electrodes 1114 and second dielectric layer 20. Second electrodes 1122 are over the third dielectric layers 1121. The third dielectric layers 1121 and second electrodes 1122 are formed as mesas 1133 oriented in rows in the x direction (FIG. 11A). A fourth dielectric layer 1131 is formed over the mesas 1133. In the embodiment of FIG. 11A, from a top-down perspective, the mesas 1133 have a rectangular shape, but other shapes, such as a square or circle are possible. The second electrodes 1122 are formed between adjacent first electrodes 1114 such that lateral edges 1123 of the second electrodes 1122 are directly over lateral edges 1115 of the first electrodes 1114.

Each phase change material layer 1116 is on a sidewall of a respective second electrode 1122 and third dielectric layer 1121 and in contact with a respective first electrode 1114. In the embodiment shown in FIGS. 11A and 11B, the phase change material layers 1116 are only on portions of the second electrode 1122 and third dielectric layer line 1121 sidewalls that are directly over a first electrode 1114.

The memory elements 1100*a*, 1100*b* correspond to where a first and second electrode and a portion of a phase change material layer 1116 intersect electrically. Each first electrode 1114 is associated with two memory elements 1100*a*, 1100*b*. In the illustrated embodiment, each second electrode 1122 is also associated with two memory elements 1100*a*, 1100*b*. To allow each memory element 1100*a*, 1100*b* to be individually addressable, a particular first electrode 1114 and a particular second electrode 1122 preferably are not associated with more than one same memory element 1100*a*, 1100*b*. In the embodiment shown, the memory element 1100*a* is associated with a first, second electrode 1122*a* and the memory element 1100*b* is associated with a second, second electrode 1122*b*.

Since the phase change material layer 1116 for each memory element 1100*a*, 1100*b* is formed only on a sidewall of a second electrode 1122, the contact area of the phase change material layer 1116 to the electrodes 1114, 1122 for each memory element 1100*a*, 1100*b* is minimized. The programming volume of the memory elements 1100*a*, 1100*b* and the voltage needed to achieve the phase change for the memory elements 1100*a*, 1100*b* is also minimized. Additionally, since the electrodes, 1114, 1122 are shared between memory elements 1100*a*, 1100*b*, the bit density of the device 1101 can be increased over prior art devices, e.g., devices including the memory element 1 (FIG. 1). Moreover, the programming volume is fixed for each memory element and does not depend on the programming pulses and device switching uniformity is also improved.

Additional dielectric layers, contact and metal lines can also be included in the device 1101. For example, contacts 1151 to first electrodes 1114 and metal lines can be included.

FIGS. 12A-12E illustrate one embodiment of a method of fabricating the phase change memory device 1101 illustrated in FIGS. 11A and 11B. No particular order is required for any of the actions described herein, except for those logically requiring the results of prior actions. Accordingly, while the actions below are described as being performed in a specific order, the order can be altered if desired.

Figure 12A:
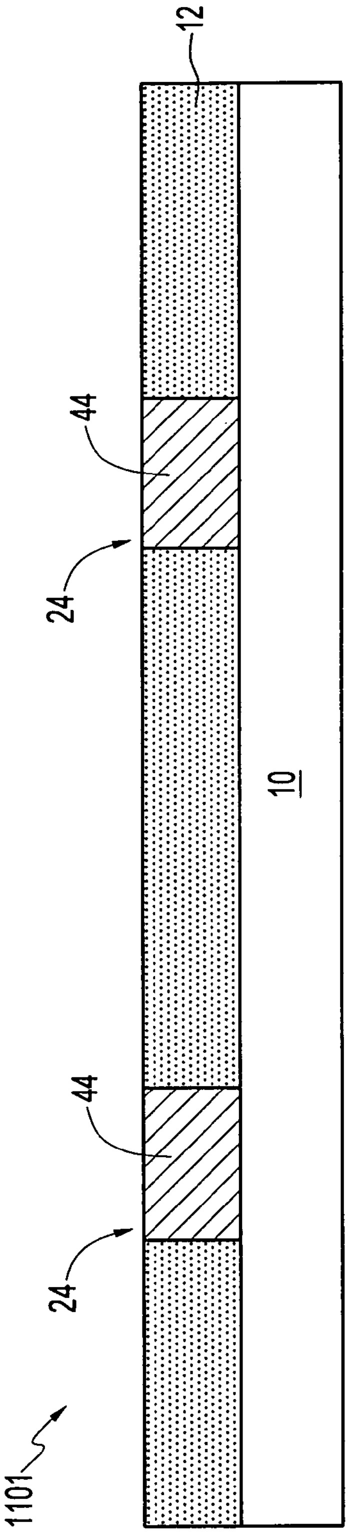
FIGS. 12A-12E illustrate partial cross-sectional views of a method of fabricating the phase change memory device of FIGS. 11A-11C.

As shown in FIG. 12A a first dielectric layer 12 is formed over a substrate 10. The first dielectric layer 12 is typically etched to create vias 24 within which conductive plugs 44 are formed. The conductive plugs 44 are formed of any suitable conductive material, such as titanium-nitride (TiN), titanium-aluminum-nitride (TiAlN), titanium-tungsten (TiW), platinum (Pt) or tungsten (W), among others.

Figure 12B:
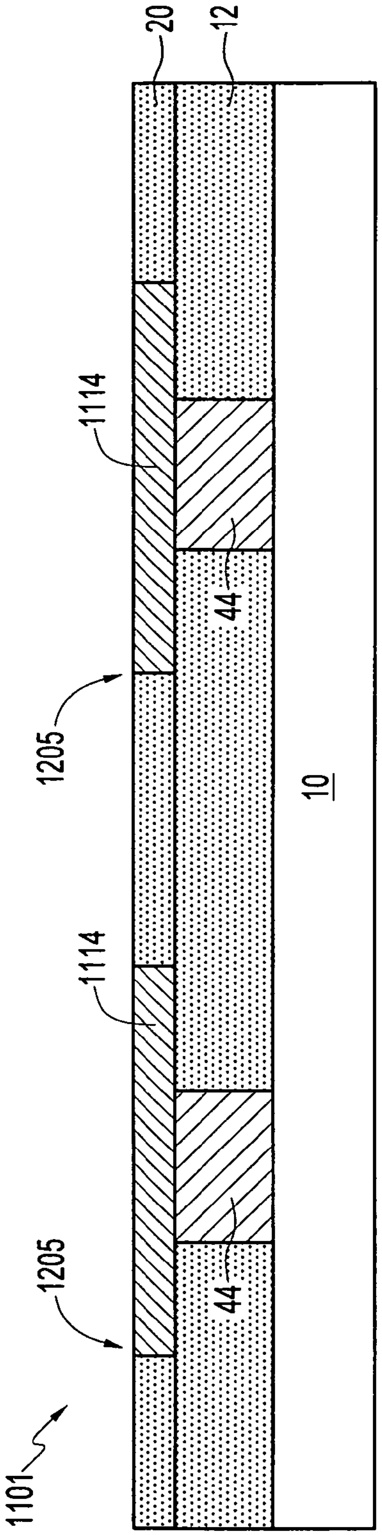

As depicted in FIG. 12B, a second insulating layer 20 is formed over the conductive plugs 44 and the first insulating layer 12. Openings 1205 are formed over and aligned with each conductive plug 44 by any suitable technique. In the illustrated embodiment, the openings 1205 are formed having a substantially square top-down shape, however the openings 1205 may have any shape, e.g., rectangular, square or other shape. The first electrodes are formed of any suitable conductive material, such as titanium-nitride (TiN), titanium-aluminum-nitride (TiAlN), titanium-tungsten (TiW), platinum (Pt) or tungsten (W), among others.

Figure 12C:
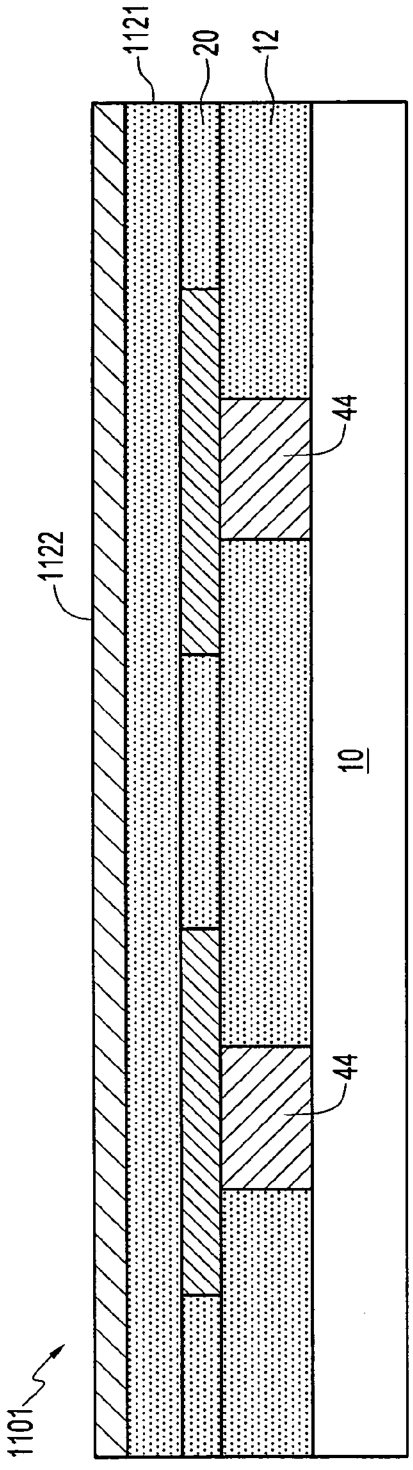

FIG. 12C illustrates the deposition of a third dielectric layer 1121 and a conductive material layer for forming second electrodes 1122. The third dielectric layer 1121 and conductive material layer are patterned into lines to form third dielectric layers 1121 and second electrodes 1122. The lateral edges 1132 (FIG. 11C) of the third dielectric layers 1121 are formed in contact with first electrodes 1114. This allows lateral edges 1123 (FIGS. 11A and 11C) of the second electrodes 1122 to be directly over lateral edges 1115 of the first electrodes 1114. The second electrodes are formed of any suitable conductive material and can be a same material as the conductive plugs 44 and/or the first electrodes 1114.

Figure 12D:
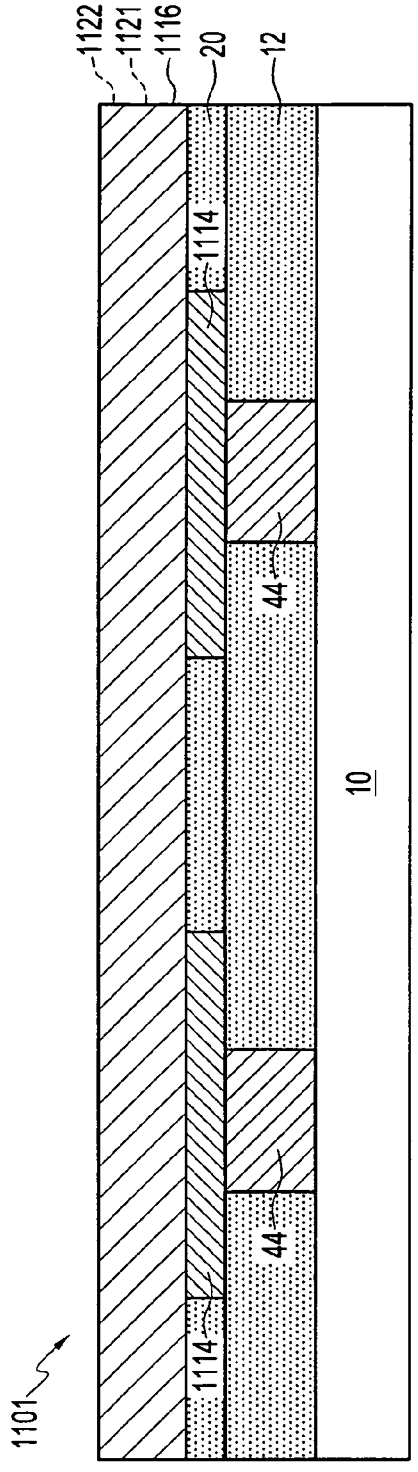

As depicted in FIG. 12D, a layer of phase change material 1116, for example a thin layer having a thickness of about 100 Å, is formed over the second electrodes 1122 and over the first electrodes 1114. Optionally, the sidewalls of the third dielectric layers 1121 and second electrodes 1122 are sloped to promote coverage of the sidewalls with the phase change material layers 1116 as shown in FIG. 11C. The phase change material is any suitable phase change material such as those described above in connection with FIG. 3C.

Figure 12E:
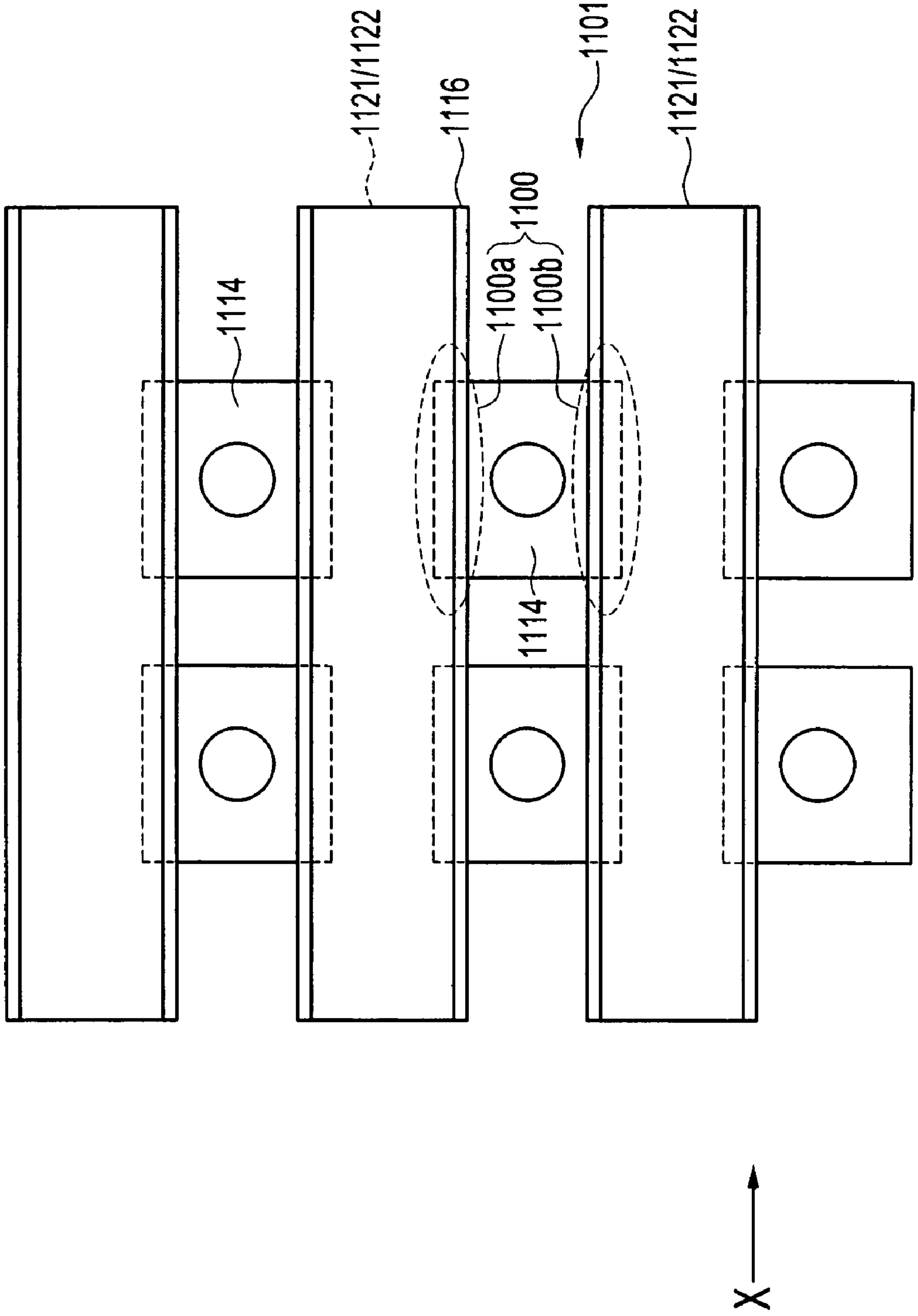

A spacer etch is used to remove the phase change material between the second electrode lines 1122 and on the upper surfaces of the second electrodes 1122, leaving thin layers 1116 of phase change material on the sidewalls of the second electrodes 1122. The programmable volume of the memory elements 1100*a*, 1100*b* can be adjusted by adjusting the thickness of the phase change material layers 1116. If desired, the phase change material layers 1116 can be left along the length of the sidewalls of each second electrode 1122. FIG. 12E is a top-down perspective of the memory device 1101 having the phase change material layers 1116 along the length of the sidewalls of each second electrode 1122.

The second electrode lines 1122 and phase change material 1116 are then etched to form individual mesas 1133 (FIGS. 11B and 11C). For this, a layer of photoresist (not shown) is formed to protect the portions of the phase change material layers 1116 in contact with the first electrodes 1114. A dry etch is performed to remove the unprotected portions of the phase change material layers 1116, third dielectric layers 1121 and second electrode lines 1122. To isolate the individual mesas 1133, a fourth dielectric layer 1131 is formed over the mesas 1133 to achieve the structure shown in FIG. 11B. By isolating the phase change material layers 1116 associated with each first electrode 1114, cross talk between memory elements 1100*a*, 1100*b* can be reduced.

Embodiments have been described as employing phase change material as a programmable resistance material. Embodiments may also employ one or more layers of other programmable resistance materials in place of the phase change material layer. Examples of other programmable resistance materials include such as metal doped chalcogenide glass and those programmable resistance materials discussed in various patents and patent applications assigned to Micron Technology, Inc., including, but not limited to the following: U.S. patent application Ser. Nos. 10/765,393; 09/853,233; 10/022,722; 10/663,741; 09/988,984; 10/121,790; 09/941,544; 10/193,529; 10/100,450; 10/231,779; 10/893,299; 10/077,872; 10/865,903; 10/230,327; 09/943,190; 10/622,482; 10/081,594; 10/819,315; 11/062,436; 10/899,010; and 10/796,000, the disclosures of each of which are incorporated herein by reference.

Figure 13:
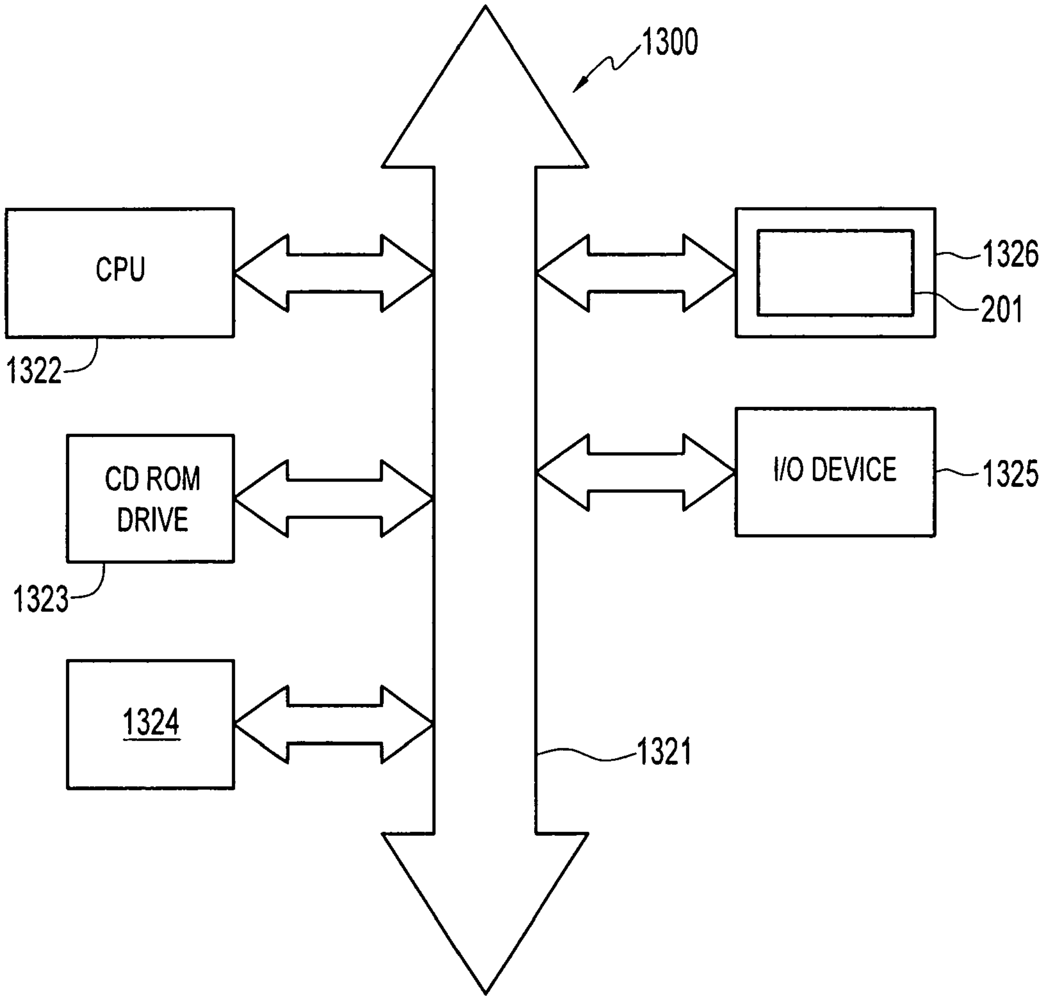
FIG. 13 is a block diagram of a processor system having a memory device incorporating a phase change memory element constructed in accordance with an embodiment of the invention.

FIG. 13 illustrates a simplified processor system 1300 which includes at least one memory circuit 1326 having a resistance variable memory device 201 constructed in accordance with the invention. The memory circuit can instead include any other resistance variable memory device, e.g., devices 401, 501, 601, 701, 801, 901, 1001, 1101, constructed in accordance with the invention.

The FIG. 13 processor system 1300, which can be any system including one or more processors, for example, a computer, phone, PDA, or other control system, generally comprises a central processing unit (CPU) 1322, such as a microprocessor, a digital signal processor, or other programmable digital logic devices, which communicates with an input/output (I/O) device 1325 over a bus 1321. The memory circuit 1326 communicates with the CPU 1322 over bus 1321 typically through a memory controller.

In the case of a computer system, the processor system 1300 may include peripheral devices such as a compact disc (CD) ROM drive 1323, which also communicate with CPU 1322 and hard drive 1324 over the bus 1321. If desired, the memory circuit 1326 may be combined with the processor, for example CPU 1322, in a single integrated circuit.

The above description and drawings are only to be considered illustrative of specific embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:

a plurality of memory cells, at least one memory cell comprising:

a first single electrode;

a resistance variable material in contact with the first single electrode;

a first, second electrode in contact with the resistance variable material and associated with the first single electrode to define a first memory element; and a second, second electrode in contact with the resistance variable material and associated with the first single electrode to define a second memory element.

2. The memory device of claim 1, further comprising a plurality of memory cells, wherein the second, second electrode is associated with at least two memory cells.

3. The memory device of claim 2, wherein the first, second electrode and the second, second electrode are conductive mesas.

4. The memory device of claim 1, wherein the first single electrode has a circular shape from a top-down perspective.

5. The memory device of claim 1, wherein the first single electrode has an annular shape from a top-down perspective.

6. The memory device of claim 1, wherein the memory cell further comprises a third, second electrode in contact with the resistance variable material and associated with the first single electrode to define a third memory element and a fourth, second electrode in contact with the resistance variable material and associated with the first single electrode to define a fourth memory element.

7. The memory device of claim 6, wherein the first single electrode and the second electrodes have approximately a "+" shape from a top-down perspective.

8. The memory device of claim 6, further comprising a plurality of memory cells, wherein each second electrode is associated with four memory cells.

9. The memory device of claim 1, wherein the resistance variable material comprises a phase change material.

10. A processor system, the system comprising:

a processor; and a memory device coupled to the processor, the memory device comprising a memory array, the memory array comprising:

a plurality of memory cells, at least one memory cell comprising:

a first memory element, the first memory element comprising a first single electrode, a first portion of resistance variable material in contact with the first single electrode, and a first, second electrode in contact with the first portion of resistance variable material; and a second memory element, the second memory element comprising the first single electrode, a second portion of resistance variable material in contact with the first single electrode, and a second, second electrode in contact with the second portion of resistance variable material.

11. The system of claim 10, wherein the second, second electrode is associated with at least two memory cells.

12. The system of claim 10, wherein the first and second portions of resistance variable material are contiguous.

13. The memory device of claim 10, wherein the at least one memory cell further comprises:

a third memory element, the third memory element comprising:

the first single electrode, a third portion of resistance variable material in contact with the first single electrode, and a third, second electrode in contact with the third portion of resistance variable material; and a fourth memory element, the fourth memory element comprising:

the first single electrode, a fourth portion of resistance variable material in contact with the first single electrode, and a fourth, second electrode in contact with the fourth portion of phase change material.

14. The system of claim 13, wherein each second electrode is associated with four memory cells.

15. A memory cell comprising:

a first single electrode;

first and second portions of resistance variable material in contact with the first single electrode;

a first, second electrode in contact with the first portion of the resistance variable material; and a second, second electrode in contact with the second portion of the resistance variable material.

16. The memory cell of claim 15, wherein the first single electrode is within a first dielectric material.

17. The memory cell of claim 16, wherein the first single electrode has a circular shape from a top-down perspective.

18. The memory cell of claim 16, wherein the resistance variable material is on sidewalls of a mesa of dielectric material.

19. The memory cell of claim 16, wherein the first and second portions of resistance variable material are on sidewalls of an opening in the first dielectric material.

20. The memory cell of claim 15, wherein the first single electrode is on sidewalls of a mesa of dielectric material.

21. The memory cell of claim 20, wherein the first single electrode has an annular shape from a top-down perspective.

22. The memory cell of claim 20, wherein the first portion resistance variable material is in contact with a first portion of the first electrode, and wherein the second portion of resistance variable material is in contact with a second portion of the first single electrode.

23. The memory cell of claim 22, wherein the first, second electrode is in contact with the first portion of resistance variable material along a top surface and a lateral surface of the first portion of resistance variable material.

24. The memory cell of claim 15, wherein the first single electrode is on sidewalls of an opening in a first dielectric material.

25. The memory cell of claim 24, wherein the first single electrode has an annular shape from a top-down perspective.

26. The memory cell of claim 24, wherein the first portion of resistance variable material is in contact with a first portion of the first single electrode, and wherein the second portion of resistance variable material is in contact with a second portion of the first single electrode.

27. The memory cell of claim 26, wherein the first, second electrode is in contact with the first portion of resistance variable material along a top surface and a lateral surface of the first portion of resistance variable material.

28. The memory cell of claim 15, wherein the first, second electrode and second, second electrode are conductive mesas, and wherein the first portion of resistance variable material is on a sidewall of the first, second electrode and the second portion of resistance variable material is on a sidewall of the second, second electrode.

29. The memory cell of claim 15, further comprising a third, second electrode in contact with a third portion of the resistance variable material and a fourth, second electrode in contact with a fourth portion of the resistance variable material.

30. The memory cell of claim 29, wherein the first single electrode has approximately a "+" shape from a top-down perspective.

31. The memory cell of claim 15, wherein the first and second portions of resistance variable material are a phase change material.

32. A method of forming a memory cell, the method comprising the act of:

forming a first single electrode;

forming first and second portions of resistance variable material in contact with the first electrode;

forming a first, second electrode in contact with the first portion of the resistance variable material; and forming a second, second electrode in contact with the second portion of the resistance variable material.

33. The method of claim 32, further comprising forming a first portion of insulating material over a substrate, wherein forming the first single electrode comprises forming the first single electrode within the first portion of insulating material.

34. The method of claim 33, wherein the first single electrode is formed having a circular shape from a top-down perspective.

35. The method of claim 33, further comprising forming a dielectric mesa over the first single electrode, wherein the first and second portions of resistance variable material are formed on sidewalls of the dielectric mesa.

36. The method of claim 33, further comprising:

forming a second portion of insulating material over the first single electrode and first portion of insulating material, and forming an opening having sloped sidewalls in the second portion of insulating material, wherein the first and second portions of resistance variable material are on sidewalls of the opening.

37. The method of claim 32, further comprising:

forming a first dielectric material over a substrate;

forming a first conductive plug within the first dielectric material; and forming a dielectric mesa over the first conductive plug, wherein the first single electrode is formed on sidewalls of the dielectric mesa.

38. The method of claim 37, wherein the first portion of resistance variable material is formed in contact with a first portion of the first single electrode, and wherein the second portion of resistance variable material is formed in contact with a second portion of the first single electrode.

39. The method of claim 38, wherein the first, second electrode is formed in contact with the first portion of resistance variable material along a top surface and a lateral surface of the first portion of resistance variable material.

40. The method of claim 37, wherein the first single electrode is formed having an annular shape from a top-down perspective.

41. The method of claim 32, further comprising:

forming a first dielectric material portion over a substrate;

forming a first conductive plug within the first dielectric material portion;

forming a second dielectric material portion over the first conductive plug and the first dielectric material portion; and forming an opening within the second dielectric material portion, the opening being formed having sloped sidewalls, wherein the first electrode is formed on sidewalls of the opening.

42. The method of claim 41, wherein the first portion of resistance variable material is formed in contact with a first portion of the first single electrode, and wherein the second portion of resistance variable material is formed in contact with a second portion of the first single electrode.

43. The method of claim 42, wherein the first, second electrode is formed in contact with the first portion of resistance variable material along a top surface and a lateral surface of the first portion of resistance variable material.

44. The method of claim 41, wherein the first single electrode is formed having an annular shape from a top-down perspective.

45. The method of claim 42, wherein forming the first, second electrode and the second, second electrode comprises forming first and second electrode lines, and wherein the first portion of resistance variable material is formed on a sidewall of the first, second electrode and the second portion of resistance variable material is formed on a sidewall of the second, second electrode.

46. The method of claim 32, further comprising:

forming a third, second electrode over the first and second portions of resistance variable material and associated with the first single electrode to define a third memory element; and forming a fourth, second electrode over the first and second portions of resistance variable material and associated with the first single electrode to define a fourth memory element.

47. The method of claim 46, wherein the first single electrode is formed having approximately a "+" shape from a top-down perspective.

48. The method of claim 32, wherein the first and second portions of resistance variable material comprises a phase change material.

49. A plurality of memory elements, comprising:

a first single electrode;

a resistance variable material in electrical communication with the first single electrode; and a plurality of second electrodes each in communication with a respective region of the resistance variable material, each respective region being continuous with each other respective region, such that each of the plurality of memory elements is formed by the first single electrode, one of the plurality of second electrodes, and a portion of the resistance variable material which is in electrical communication with the first single electrode and the one of the plurality of second electrodes.

50. The memory elements of claim 49 wherein the plurality of second electrodes is two second electrodes.

51. The memory elements of claim 50 wherein the second electrodes are conductive mesas.

52. The memory elements of claim 49, wherein the first single electrode has a circular shape from a top-down perspective.

53. The memory elements of claim 49, wherein the first single electrode has an annular shape from a top-down perspective.

54. The memory elements of claim 49, wherein the resistance variable material comprises a phase change material.

55. A method of forming a memory cell, the method comprising the act of:

forming a first single electrode;

forming a continuous portion of resistance variable material in electrical communication with the first single electrode; and forming a plurality of second electrodes each in communication with a respective region of the continuous portion resistance variable material, such that the memory cell is formed by the first single electrode, one of the plurality of second electrodes, and a region of the continuous portion resistance variable material which is in electrical communication with the one of the plurality of second electrodes.

56. The method of claim 55, further comprising forming a first portion of insulating material over a substrate, wherein forming the first single electrode comprises forming the first single electrode within the first portion of insulating material.

57. The method of claim 56, wherein the first single electrode is formed having a circular shape from a top-down perspective.

58. The method of claim 56, further comprising forming a dielectric mesa over the first single electrode, wherein the at least one layer of continuous portion of resistance variable material is formed on sidewalls of the dielectric mesa.

59. The method of claim 56, further comprising:

forming a second portion of insulating material over the first single electrode and first portion of insulating material, and forming an opening having sloped sidewalls in the second portion of insulating material, wherein the resistance variable material is on sidewalls of the opening.

60. The method of claim 55, further comprising:

forming a first dielectric material over a substrate;

forming a first conductive plug within the first dielectric material; and forming a dielectric mesa over the first conductive plug, wherein the first single electrode is formed on sidewalls of the dielectric mesa.

61. The method of claim 60, further comprising an act of forming first and second resistance variable material portions, wherein the first resistance variable material portion is formed in electrical communication with a first portion of the first single electrode, and wherein the second resistance variable material portion is formed in electrical communication with a second portion of the first single electrode.

62. The method of claim 61, wherein one of the plurality of second electrodes is formed in electrical communication with the first resistance variable material portion along a top surface and a lateral surface of the first resistance variable material portion.

63. The method of claim 60, wherein the first single electrode is formed having an annular shape from a top-down perspective.

64. The method of claim 55, further comprising:

forming a first portion of dielectric material over a substrate;

forming a first conductive plug within the first portion of dielectric material;

forming a second portion of dielectric material over the first conductive plug and the first portion of dielectric material; and forming an opening within the second portion of dielectric material, the opening being formed having sloped sidewalls, wherein the first single electrode is formed on sidewalls of the opening.

65. The method of claim 64, further comprising forming first and second resistance variable material portions, wherein the first resistance variable material portion is formed in electrical communication with a first portion of the first electrode, and wherein the second resistance variable material portion is formed in electrical communication with a second portion of the first electrode.

66. The method of claim 65, wherein one of the plurality of second electrodes is formed in electrical communication with the first resistance variable material portion along a top surface and a lateral surface of the first resistance variable material portion.

67. The method of claim 64, wherein the first electrode is formed having an annular shape from a top-down perspective.

68. The method of claim 55, further comprising forming first and second resistance variable material portions, wherein forming the plurality of second electrodes comprises forming first and second electrode lines, and wherein the first resistance variable material portion is formed on a sidewall of a first, second electrode and the second resistance variable material portion is formed on a sidewall of a second, second electrode.

69. The method of claim 55, further comprising:

forming a first single, second electrode over the resistance variable material and associated with the first single electrode to define a first memory element;

forming a second, second electrode over the resistance variable material and associated with the first single electrode to define a second memory element;

forming a third, second electrode over the resistance variable material and associated with the first single electrode to define a third memory element; and forming a fourth, second electrode over the resistance variable material and associated with the first single electrode to define a fourth memory element.

70. The method of claim 69, wherein the first electrode is formed having approximately a "+" shape from a top-down perspective.

* * * * *

UNITED STATES PATENT AND TRADEMARK OFFICE

CERTIFICATE OF CORRECTION

PATENT NO. : 7,560,723 B2
APPLICATION NO. : 11/511311
DATED : July 14, 2009
INVENTOR(S) : Jun Liu It is certified that error appears in the above-identified patent and that said Letters Patent is hereby corrected as shown below:

In column 12, line 27, in Claim 22, after “portion” insert -- of --.

In column 15, lines 7–8, in Claim 58, after “wherein the” delete “at least one layer of”.

Signed and Sealed this

Fifteenth Day of September, 2009

David J. Kappos
*Director of the United States Patent and Trademark Office*